United States Patent [19]
Lee et al.

[11] Patent Number: 6,040,241
[45] Date of Patent: Mar. 21, 2000

[54] METHOD OF AVOIDING SIDEWALL RESIDUE IN FORMING CONNECTIONS

[75] Inventors: Tzung-Han Lee, Taipei; Horng-Nan Chern, Tainan, both of Taiwan

[73] Assignee: United Microelectronics Corp., Hsinchu, Taiwan

[21] Appl. No.: 09/021,750

[22] Filed: Feb. 11, 1998

[51] Int. Cl.$^7$ .................................................. H01L 21/336
[52] U.S. Cl. .......................... 438/622; 438/303; 438/305; 438/592
[58] Field of Search ........................... 438/622, 257–267, 438/275, 283, 303, 305, 592

[56] References Cited

U.S. PATENT DOCUMENTS

| | | | |
|---|---|---|---|
| 5,210,047 | 5/1993 | Woo et al. | 438/257 |
| 5,262,352 | 11/1993 | Woo et al. | 438/625 |
| 5,545,578 | 8/1996 | Park et al. | 438/303 |
| 5,612,240 | 3/1997 | Chang | 438/297 |
| 5,668,065 | 9/1997 | Lin | 438/303 |
| 5,679,591 | 10/1997 | Lin et al. | 438/257 |
| 5,723,377 | 3/1998 | Torii | 438/303 |
| 5,759,901 | 6/1998 | Loh et al. | 438/305 |
| 5,773,341 | 6/1998 | Green et al. | 438/253 |
| 5,776,806 | 7/1998 | Dennison et al. | 438/199 |
| 5,798,279 | 8/1998 | Crisenza et al. | 438/201 |
| 5,837,568 | 11/1998 | Yoneda et al. | 438/147 |
| 5,840,607 | 11/1998 | Yeh et al. | 438/257 |

*Primary Examiner*—Charles Bowers
*Assistant Examiner*—Thanh Nguyen
*Attorney, Agent, or Firm*—Merchant & Gould P.C.

[57] ABSTRACT

The method in the present invention for forming insulation over conductor includes the following steps. At first, a substrate with a first conductor formed over is provided. The first conductor can be either a gate structure or an interconnection layer. A dielectric layer is then formed over the first conductor the substrate. A portion of the dielectric layer is removed for having a recess free sidewall on the dielectric layer around the first conductor. An insulation for succeeding conductive layer is formed.

13 Claims, 3 Drawing Sheets

METHOD OF AVOIDING SIDEWALL RESIDUE IN FORMING CONNECTIONS

FIELD OF THE INVENTION

The present invention relates to the semiconductor fabrication, and more specifically to the method of avoiding sidewall residue in forming connections.

BACKGROUND OF THE INVENTION

In the semiconductor fabrication process, a series of steps is performed to form connections between the devices after they arc finished. The connection forming process is a vital element in determining the operation of the devices. Every connection to the individual device and region must be formed with low resistance and leakage. Any undesired connecting between individual circuit path might cause the incorrect operation of the circuits and the fail or damage of the devices. With the progressing of the semiconductor integrated circuits to the ULSI (ultra large scale integration) level, the connections must be formed with less defects. Thus the accuracy, quality, and reliability of the connections must be raised.

In general, the connections on the integrated circuits are formed with multiple layers which are stacked sequentially over the semiconductor substrate. The materials of the connections can include conductive materials like polysilicon, aluminum, titanium, aluminum, tungsten suicide, and etc. Each layer of connections can be formed of a single material, or a combination of different conductive materials.

Without limiting the scope of the present invention, the background of the invention is illustrated with the formation of the first interconnection layer on a semiconductor. Referring to FIG. 1, a semiconductor substrate 10 with a gate structure 12 formed over is illustrated. A pad insulator 14 like oxide is formed between the semiconductor substrate 10 and the gate structure 12 to serve as a gate insulator. The gate structure 12 is formed for the fabrication of active devices. The gate structure 12 with a combination of layers is employed in most conventional semiconductor fabrication process. As an example, the gate structure 12 can be a combination of a polysilicon layer 16, a tungsten silicide layer 18, and an insulator including 20 and 22. The insulator 20 and 22 formed respectively on top and sidewall of the polysilicon layer 16 and the tungsten silicide layer 18 can be nitride for insulating the conductive gate.

The polysilicon layer 16, the tungsten silicide layer 18, and the top insulator 22 in the stacked combination have diverse physical and chemical properties. The combined structure need to be processed with multiple clean steps before the formation of the sidewall insulator 22. Under the different physical and chemical properties, some lateral portion of the tungsten silicide layer 18 is removed in the clean steps. A tungsten silicide layer 18 narrower than the polysilicon layer 16 and the top insulator 22 can be found as shown in FIG. 1. The sidewall insulator 22 is formed conformably on the sidewall of the stacked combination. Thus a recessed region 22a on the sidewall of the sidewall insulator 22 is formed.

For forming the first connection layer, a dielectric layer 24 is then deposited over the gate structure 12 and the semiconductor substrate 10, as shown in FIG. 2. An oxide layer deposited with chemical vapor deposition (CVD) is employed. With the conformability of the oxide layer 24, the profile of the sidewall insulator 22 with a duplicated recessed region 24a is formed. For a widely applied reaction gas of tetra-ethyl-ortho-silicate (TEOS) in the CVD process, the recess problem is further enhanced for the better conformability of the TEOS oxide layer 24. A conductive layer 26 is then formed over the oxide layer 24. A portion of the conductive layer 26 is removed with a patterning process to define the pattern of interconnections. A portion of the conductive layer 26, the residue 26a, is left within the recessed region on the sidewall of the oxide layer 24 due to the lateral recessed profile.

The residue 26a on the sidewall causes the hazard of short connections between the individual circuit paths defined on the conductive layer 26. The short connection is formed when two individual paths cross over a common residue 26a and form a electrically conductive connection through the conductive residue 26a. The short connections on the integrated circuits ruined the design of the circuits and cause the unexpected operation of the devices. Thus lots of devices with embedded and unrecoverable operational failures can be formed. The yield of the semiconductor manufacturing process is influenced considerably at the same time.

SUMMARY OF THE INVENTION

A method of avoiding sidewall residue in forming connections is provided in the present invention. A recess free dielectric layer can be formed with the method disclosed. Thus the residue formed during the patterning of a conductive layer can be eliminated. The hazard of short connections between the individual circuit paths defined on the conductive layer can be reduced. The yield of the semiconductor manufacturing process can be raised in accompanying with the elimination of the residue problem.

The method in the present invention for forming insulation over conductor includes the following steps. At first, a substrate with a first conductor formed over is provided. The first conductor can be either a gate structure or an interconnection layer. A dielectric layer is then formed over the first conductor and the substrate. A portion of the dielectric layer is removed for having a recess free sidewall on the dielectric layer around the first conductor. An insulation for succeeding conductive layer is formed.

In addition, two more steps can be added to form connections. A step of forming a second conductor over the dielectric layer is performed. Another step of removing a portion of the second conductor to define a second conductor pattern is then employed to finish a layer with interconnection paths.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings.

DETAILED DESCRIPTION OF THE PREFERRED EMBODIMENT

A method of avoiding sidewall residue in forming connections is provided in the present invention. A recess free dielectric layer can be formed with the method disclosed. A step to remove a portion of the dielectric layer is applied. The sidewall profile of the dielectric layer is improved to be free of recess. No residue can be formed during the patterning of a conductive layer on the improved profile.

Figure 1:
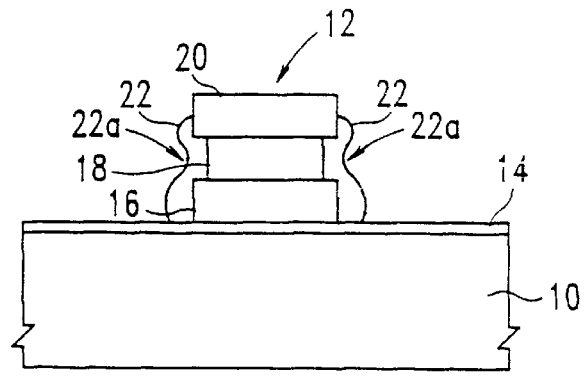
FIG. 1 illustrates a cross sectional view of a semiconductor substrate with a gate structure formed over in the prior art.
Figure 2:
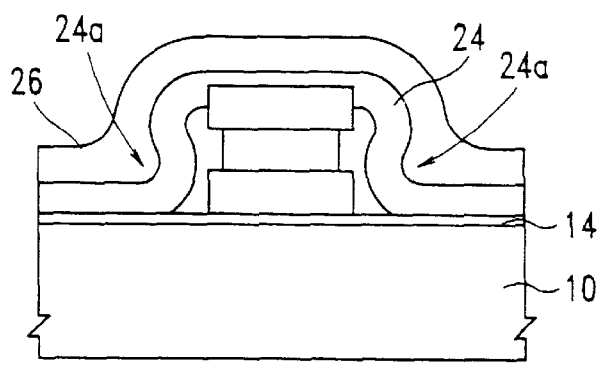
FIG. 2 illustrates a cross sectional view of a dielectric layer and a conductor layer over the semiconductor substrate in the prior art.
Figure 3:
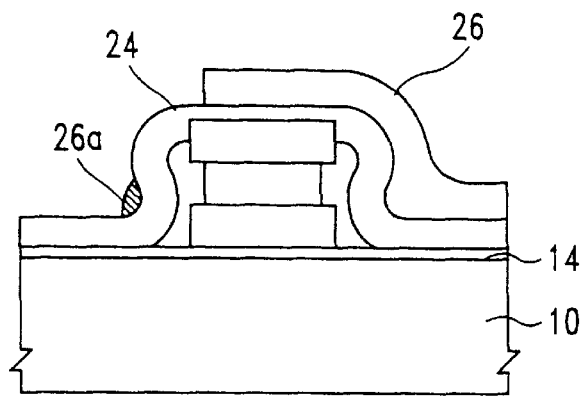
FIG. 3 illustrates a cross sectional view of a residue of the conductor layer in the prior art.
Figure 4:
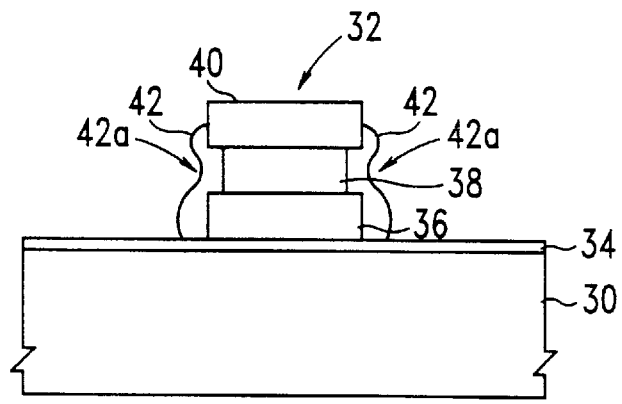
FIG. 4 illustrates a cross sectional view of a semiconductor substrate with a gate structure formed over in the present invention.

The present invention in forming connections can be applied in the formation of different layers of multiple layer interconnections. Without limiting the scope of the present invention, the formation of the first interconnection layer on a semiconductor substrate is illustrated as an embodiment. Referring to FIG. 4, a semiconductor substrate 30 is provided. A semiconductor substrate 30 with a preferable single crystalline silicon in a <100> crystalline direction is widely employed in the present semiconductor fabrication process. A first conductor, like a gate structure 32 is formed over the semiconductor substrate 30. The first conductor can also be an interconnection layer which is a combination of conductive layers. A pad insulator 34, like a pad oxide layer, is formed between the semiconductor substrate 30 and the gate structure 32 to serve as a gate insulator. The gate structure 32 is formed for the fabrication of active devices like MOSFET (metal oxide semiconductor field effect transistor). In general, the gate structure 32 is formed by combining multiple layers in most semiconductor fabrication process. As an example, the gate structure 32 can be a combination of a polysilicon layer 36, a tungsten silicide layer 38, and an insulator including 40 and 42. The insulator 40 and 42 formed respectively on top and sidewall of the polysilicon layer 36 and the tungsten silicide layer 38 can be nitride for insulating the conductive gate.

Figure 5:
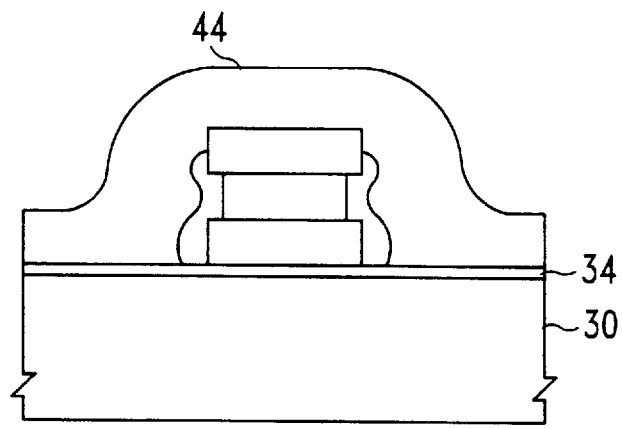
FIG. 5 illustrates a cross sectional view of forming a dielectric layer over the first conductor and the semiconductor substrate.
Figure 6:
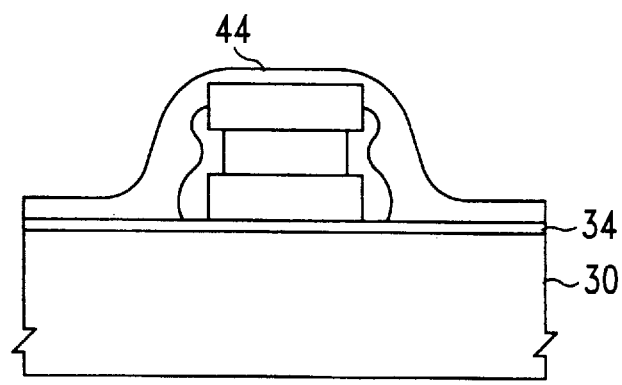
FIG. 6 illustrates a cross sectional view of removing a portion of the dielectric layer for having a recess free sidewall in the present invention.

A recessed region 42a is formed on the sidewall of the sidewall insulator 42 as mentioned in the background of the invention. The narrowing of the tungsten silicide layer 38 during the cleaning process is the major issue. A dielectric layer 44 is then deposited over the gate structure 36 and the semiconductor substrate 30, as shown in FIG. 5. A thicker dielectric layer 44 then conventional process is formed in the present invention. An oxide layer deposited with chemical vapor deposition (CVD) can employed as the dielectric layer 44. Several kinds of reaction gas can be employed in the CVD process, like tetra-ethyl-ortho-silicate (TEOS), SiH4, and other silane based gas. A CVD process using reaction gas of TEOS is utilized for forming the oxide layer. A portion of the dielectric layer 44 is removed for having a recess free sidewall on the dielectric layer around the first conductor, as shown in FIG. 6. As a preferred embodiment, an etching back process can be utilized. An isotropic etching process like a reactive ion etching (RIE) process is used to get a taper free sidewall profile of the dielectric layer 44. Thus the recessed region on the sidewall of the sidewall insulator 42 won't be duplicate and a recess free sidewall of the dielectric layer 44 can be achieved.

Although a thicker dielectric layer 44 is preferred in the present invention for later reshaping, a dielectric layer 44 which combines two or more layers of dielectric materials can be used. For example, two oxide layers can be formed with different process to serve as the dielectric layer 44. And an etching back process can be performed in the same way to reshaping the dielectric layer 44 to have a recess free sidewall. Thus the hazard of short connections between the individual circuit paths defined with the second conductor layer can be greatly reduced.

Figure 7:
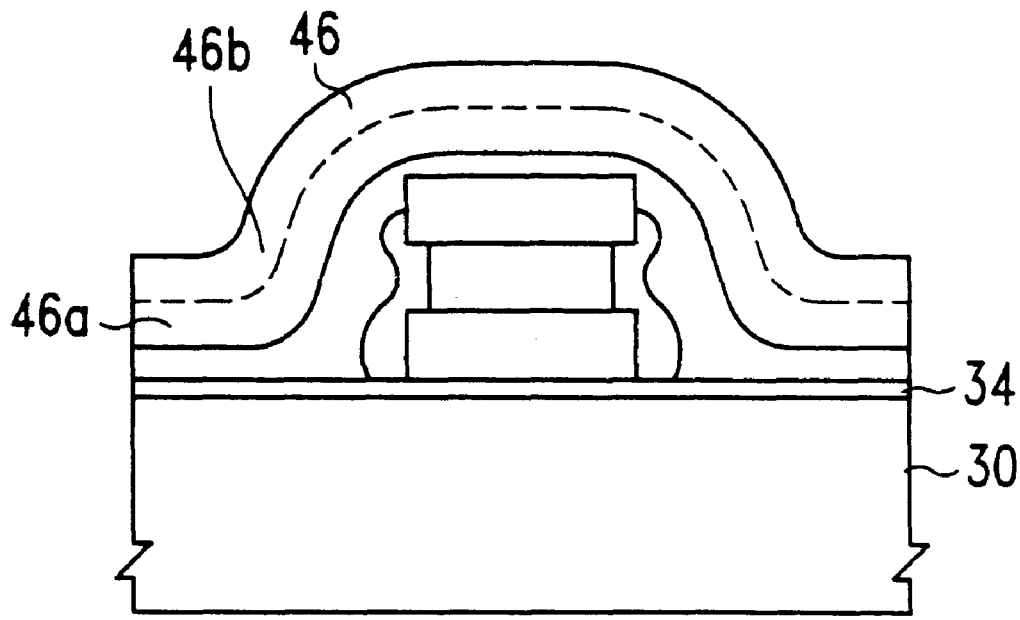
FIG. 7 illustrates a cross sectional view of forming a second conductor in the present invention.
Figure 8:
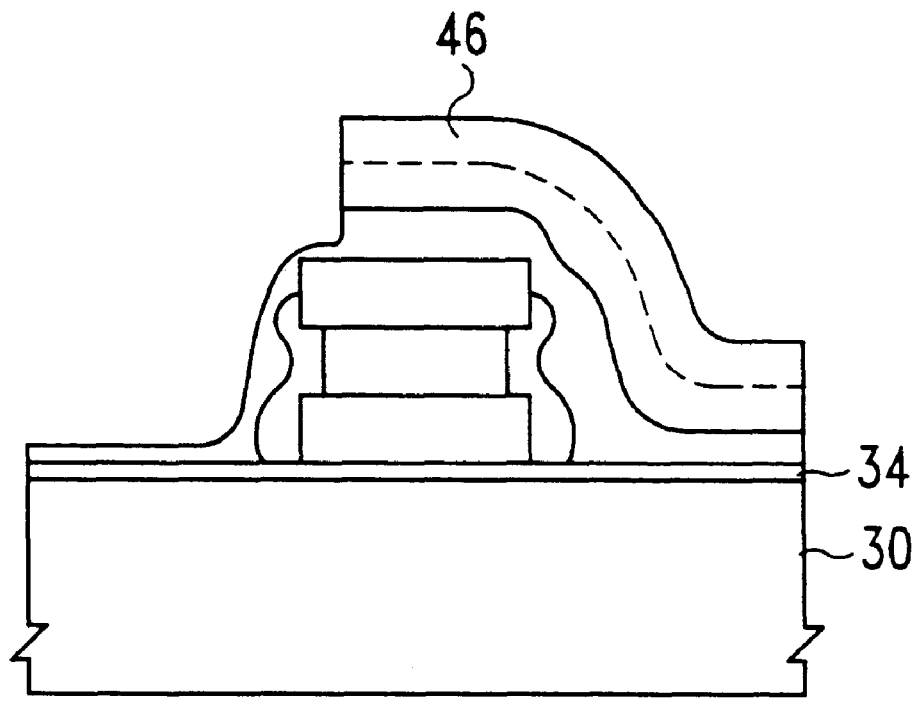
FIG. 8 illustrates a cross sectional view of removing a portion of the second conductor to define a second conductor pattern in the present invention.

After the formation of the dielectric layer 44, two more steps can be performed to form a succeeding conductive layer and finish the interconnections. As shown in FIG. 7, a second conductor 46 is formed over the dielectric layer 44. In general, the second conductor 46 can be a polysilicon layer formed by a CVD process. Alternatively, the second conductor 46 can be a combination of conductive layers, like a polysilicon layer 46a and a tungsten silicide layer 46b. Then a portion of the second conductor is removed to define a second conductor pattern, as shown in FIG. 8. A patterning process including a lithography process and an etching process is utilized. Since an improved profile of the sidewall of the dielectric layer 44 is provided in the present invention, the second conductor 46 can be patterned without leaving undesired residue.

With the method disclosed in the present invention, a dielectric layer 44 can be formed free of any recess on the side wall. The residue problem in forming the succeeding second conductor can be eliminated. The short connection between individual paths on the same conductive layer is avoided. Thus the integrated circuits without operational failures coming from misconnection can be fabricated. The yield of the semiconductor manufacturing process is greatly raised by the method of the present invention.

As is understood by a person skilled in the art, the foregoing descriptions of the preferred embodiment of the present invention is an illustration of the present invention rather than a limitation thereon. It is intended to cover various modifications and similar arrangements included within the spirit and scope of the appended claims. The scope of the claims should be accorded to the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. A method for forming insulation over conductor, said method comprising the steps of:

providing a substrate with a gate structure formed over, wherein said gate structure includes:
a polysilicon layer over said substrate;
a tungsten silicide layer over said polysilicon layer;
an upper insulator layer over said tungsten silicide layer; and
insulator spacers with a recessed region covering conformably on sidewalls of said upper insulator layer, said tungsten silicide layer and said polysilicon layer;

forming a dielectric layer over said gate structure and said substrate; and performing an etching back process to remove a portion of said dielectric layer for thinning said dielectric layer and having a recess free sidewall on said dielectric layer around said gate structure.

2. The method of claim 1, wherein said method further comprising the steps of forming a conductor over said dielectric layer; and removing a portion of said conductor to define a conductor pattern.

3. The method of claim 2, wherein said conductor comprises a combination of conductive layers to serve as an interconnection layer.

4. The method of claim 1, wherein said recessed region on sidewall is due to said narrower tungsten silicide layer formed by clean process before said insulator spacer formed.

5. The method of claim 1, wherein said dielectric layer comprises an oxide layer.

6. The method of claim 5, wherein said oxide layer is formed by chemical vapor deposition with a reaction gas of tetra-ethyl-ortho-silicate (TEOS).

7. The method of claim 1, wherein said dielectric layer comprises at least two oxide layers.

8. A method for forming connection, said method comprising the steps of:

providing a substrate with a gate structure formed over, wherein said gate structure includes:
a polysilicon layer over said substrate;
a tungsten silicide layer over said polysilicon layer;
an upper insulator layer over said tungsten silicide layer; and
nitride spacers with a recessed region covering conformably on sidewalls of said upper insulator layer, said tungsten silicide layer and said polysilicon layer;

forming a dielectric layer over said gate structure and said substrate;

performing an etching back process to remove a portion of said dielectric layer for thinning said dielectric layer and having a recess free sidewall on said dielectric layer around said gate structure;

forming a conductor over said dielectric layer; and removing a portion of said conductor to define a conductor pattern.

9. The method of claim 8, wherein said recessed region on sidewall is due to said narrower tungsten silicide layer formed by clean process before said insulator spacer formed.

10. The method of claim 8, wherein said conductor comprises a combination of conductive layers to serve as an interconnection layer.

11. The method of claim 8, wherein said dielectric layer comprises an oxide layer.

12. The method of claim 8, wherein said oxide layer is formed by chemical vapor deposition with a reaction gas of tetra-ethyl-ortho-silicate (TEOS).

13. The method of claim 8, wherein said dielectric layer comprises at least two oxide layers.

* * * * *